(12) United States Patent
Burr

(10) Patent No.: US 6,303,444 B1
(45) Date of Patent: Oct. 16, 2001

(54) METHOD FOR INTRODUCING AN EQUIVALENT RC CIRCUIT IN A MOS DEVICE USING RESISTIVE WELLS

(75) Inventor: James B. Burr, Foster City, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/693,715

(22) Filed: Oct. 19, 2000

(51) Int. Cl.[7] ................................................ H01L 21/336
(52) U.S. Cl. ........................ 438/289; 438/210; 438/217
(58) Field of Search .................................... 438/210, 217, 438/238, 289, 290, 291, 292, 382

(56) References Cited

U.S. PATENT DOCUMENTS

| 4,735,914 | * | 4/1988 | Hendrickson et al. | 438/289 |
| 6,071,768 | * | 6/2000 | Duvvury et al. | 438/234 |
| 6,093,951 | * | 7/2000 | Burr | 257/408 |
| 6,100,567 | * | 8/2000 | Burr | 257/365 |
| 6,137,142 | * | 10/2000 | Burr | 257/349 |
| 6,218,708 | * | 4/2001 | Burr | 257/372 |

* cited by examiner

Primary Examiner—Chandra Chaudhari
(74) Attorney, Agent, or Firm—Gunnison, McKay & Hodgson, L.L.P.; Philip J. McKay

(57) ABSTRACT

A method for providing low power MOS devices that include buried wells specifically designed to provide a resistive path between the bulk material of the device and a well tie contact. By providing a resistive path, an equivalent RC circuit is introduced to the device that allows the bulk material potential to track the gate potential, thereby advantageously lowering the threshold voltage as the device turns on and raising the threshold voltage as the device turns off. In addition, the introduction of the resistive path also allows the bulk material potential to be controlled and stabilize at an equilibrium potential between clock cycles.

23 Claims, 10 Drawing Sheets

METHOD FOR INTRODUCING AN EQUIVALENT RC CIRCUIT IN A MOS DEVICE USING RESISTIVE WELLS

CROSS REFERENCE TO RELATED PATENTS AND PATENT APPLICATIONS

This application is related to: U.S. Pat. No. 6,093,951, filed Jun. 30, 1997, entitled "MOS DEVICES WITH RETROGRADE POCKET REGIONS", and naming James B. Burr as inventor; U.S. patent application Ser. No. 09/028,472, filed Feb. 24, 1998, entitled "MOS DEVICE STRUCTURE AND METHOD FOR REDUCING PN JUNCTION LEAKAGE", and naming James B. Burr as inventor; U.S. patent application Ser. No. 09/095,550, filed Jun. 11, 1998, entitled "TUNABLE THRESHOLD SOI DEVICE USING BACK GATE AND INTRINSIC CHANNEL REGION", and naming James B. Burr as inventor; U.S. patent application Ser. No. 09/030,030, filed Feb. 25, 1998, entitled "BACK-BIASED MOS DEVICE AND METHOD", and naming James B. Burr and James E. Murguia as inventors; U.S. patent application Ser. No. 09/693,745, filed Oct. 18, 2000, entitled "TRANSISTOR DEVICE INCLUDING A RESISTIVE WELL", filed Oct. 19, 2000 and naming James B. Burr as inventor, all of which are assigned to the assignee of the present invention and are incorporated herein, in their entirety, by reference for all purposes.

FIELD OF THE INVENTION

The present invention relates generally to transistor devices and, more particularly, to low power and ultra-low power MOS devices.

BACKGROUND OF THE INVENTION

With the emergence of an electronics market that stresses portability, compact size, lightweight and the capability for prolonged remote operation, a demand has arisen for low power and ultra-low power transistor devices and systems. To meet this demand devices are emerging which have extremely low threshold voltages.

There are a number of factors that contribute to the magnitude of a device's threshold voltage. For example, to set a device's threshold voltage near zero, light doping and/or counter doping in the channel region of the device may be provided. However, due to processing variations, the exact dopant concentration in the channel region can vary slightly from device to device. Although these variations may be slight, they can shift a device's threshold voltage by a few tens or even hundreds of millivolts. Further, dimensional variations, such as oxide thickness, channel width, channel length, charge trapping in materials and interfaces, and environmental factors, such as operating temperature fluctuations, can shift the threshold voltage.

Lowering the threshold voltage of a device typically decreases active power dissipation by permitting the same performance to be achieved at a lower supply voltage. However, lowering the threshold voltage of a device normally increases standby power dissipation by increasing device leakage and devices having low threshold voltages can leak so much current when their circuits are in a sleep or standby mode that the gains made by lowering the threshold voltage are outweighed by the power lost to leakage.

Consequently, it is particularly desirable in low-threshold devices to provide a mechanism for tuning the threshold voltage to account for these and other variations. Tuning the threshold voltage of a device can be accomplished using back biasing, i.e. controlling the potential between a device's well and source. See James B. Burr, "Stanford Ultra-Low Power CMOS," Symposium Record, Hot Chips V, pp. 7.4.1–7.4.12, Stanford, Calif. 1993, which is incorporated, in its entirety, herein by reference. Back-biasing is used to electrically tune the transistor thresholds by reverse biasing the bulk of each MOS transistor, relative to the source, to adjust the threshold potentials. Typically, the potential will be controlled through isolated contacts to the source and well regions together with circuitry necessary for independently controlling the potential of these two regions.

FIG. 1A illustrates a prior art device 100A in which each of an NFET 101 and a PFET 102 essentially constitutes a four-terminal device. NFET 101 is made up of an N-region source 103, a gate electrode 104, an N-region drain 105, and a P-bulk material 106. Similarly, PFET 102 includes P-region source 108, a gate electrode 109 and a P-region drain 110 formed in an N-well 111. The device of FIG. 1A also includes a P plug that forms a well tie 112 for P-bulk material 106, and an N plug that forms a well tie 113 for N-well 111.

In the back-biased CMOS design of FIG. 1A, well tie 112 of bulk material 106 is electrically isolated from source 103 of NFET 101 by providing a separate metallic rail contact 116 which is spaced from metallic rail contact 114 of source 103. Rail contact 116 is connected to a bias voltage source Vpw. Likewise, well contact 113 of N-well 111 is split off from source 108 of PFET 102 by providing a separate metallic rail contact 118 that is electrically isolated from metallic rail contact 115 of source 108. Rail contact 118 is connected to a bias voltage source Vnw.

According to the structure of prior art device 100A, the substrate bias potential of NFET 101 is set by Vpw, and that of PFET 102 is set by Vnw. In other designs, a number of transistors are formed in a common well. In these designs, the bias potential may be routed within a surface well.

FIG. 1B illustrates a device 100B similar to device 100A of FIG. 1A, except that bulk material 106 of the NFET 101 in FIG. 1B. is biased to Vpw by way of a metallic back plane 119, rather than by way of well tie 116 as shown in FIG. 1A.

FIG. 1C shows a portion of prior art back biased device 100A including NFET 101. In the discussion below, NFET 101 was chosen for illustrative purposes only. Those of skill in the art will recognize that PFET 102 could also have been chosen and that the discussion and effects discussed below would be equally applicable, with the exception that the polarities would be reversed.

In FIG. 1C, the well-known effect of coupling capacitance between gate 104 and bulk material 106 is represented by gate-bulk coupling capacitance 150 and the well known effects of coupling capacitance between drain 105 and bulk material 106 is represented by drain-bulk coupling capacitance 152. Due to gate-bulk coupling capacitance 150, there is a tendency for the voltage of bulk material 106, V-bulk, to track the voltage on gate 104. As discussed in more detail below, if this tracking were allowed, there is a tendency to raise V-bulk and decrease the threshold voltage of NFET 101 as device 101 turns on, and, as discussed above, lowering the threshold voltage of a device such as NFET 101 has several benefits. However, in the prior art, a significant amount of effort, and virtually all teaching, was directed to keeping V-bulk constant during a switching event and preventing significant changes in the potential of bulk material 106 during a switching event. To this end, it was taught that bulk material 106 should be the lowest resistance possible and that bulk material 106 should be connected as directly as possible to ground or some other drain-off potential.

The main reason that the prior art taught keeping V-bulk constant, and bulk material 106 as low a resistive value as possible, is that in prior art CMOS designs two problems were always being dealt with: large impact ionization currents and/or latch up.

Impact ionization currents are created because the potentials in standard CMOS devices are high, on the order of 1.5 to 5.0 volts. At these potentials, charge carriers acquire so much kinetic energy that the impact of the carriers at the drain end of the channel can result in the generation of electron-hole pairs. Typically, in an NFET, the electrons move across the channel to the drain while the holes move into bulk material 106 thus creating potentially large sub-currents in bulk material 106. In the prior art, if bulk material 106 were composed of even moderately resistive material, these sub-currents would result in large voltage drops throughout bulk material 106.

FIG. 1D shows a graph of the natural log of the substrate current in an N-well (Inw) and P-well (Ipw) due to impact ionization as a function of the source to drain potential (Vds) of a device. It is worth noting for later reference that at a Vds of 1.0 volts (120) or less, there is virtually no impact ionization current, while at the typical prior art CMOS Vds of 1.5 (123) to 5.0 (125) volts the impact ionization current is relatively high.

In addition to minimizing the effects of impact ionization current, the prior art taught that bulk material 106 must be low resistance, and kept at a constant potential, to avoid latch-up. Latch-up is a well-known result of CMOS design that inherently includes parasitic bipolar transistors cross-coupled in the device. As a result of these parasitic bipolar transistors, if the potential of bulk material (Vpw) 106 becomes sufficiently large and forward biased, or if the n-well potential (Vnw) of n-well 111 (see FIG. 1A) becomes sufficiently lower than the supply voltage (Vdd), a short is created between ground (gnd) and supply voltage (Vdd). This short could draw enough current to not only shut down or "latch-up" the device, but in many cases, the current draw was large enough to physically destroy the device. Latch-up typically occurs in devices with supply voltages of 0.8 volts or greater. Note that in some cases, latch-up could be prevented even if the supply voltage is greater than 0.8V using back bias. A back biased bulk is much less likely to rise sufficiently above ground to turn on the parasitic NPN; likewise, a back biased N-well is much less likely to decrease sufficiently below Vdd to turn on the PNP.

Both impact ionization current and latch-up are well known to those of skill in the art. As a result of these known effects, prior art CMOS devices, and the entire teaching in the prior art, was directed to devices which minimize these effects by having low resistance bulk materials 106 and keeping the bulk potential, V-bulk, as constant as possible.

FIG. 1E shows the relationship between: the gate potential 160 (Vg 160) of gate 104 (FIG. 1C); the drain potential 170 (Vd 170) of drain 105; and the bulk potential 180 (V-bulk 180) in a device designed according to the prior art CMOS structures and teachings.

In FIG. 1E, at time T0: Vg 160 is at potential 161, typically near a digital zero; Vd 170 is at potential 171, typically near a digital one; and V-bulk 180 is at equilibrium potential 181, in one embodiment ground. In time interval 191, i.e., between T1 and T2, the device turns on and: Vg 160 rises along ramp 163 from potential 161, typically near digital zero, to potential 165, typically near digital one; at the same time, due to gate-bulk coupling capacitance 150, V-bulk 180 increases slightly from equilibrium potential 181, typically ground, to potential 183, typically greater than ground, but significantly less than digital one. In one embodiment, potential 183 is 10 to 100 millivolts greater than equilibrium potential 181.

During this same time frame, i.e., time interval 191, Vd 170 remains relatively constant at near digital one. From time T2 on, Vg 160 also remains relatively constant at near digital one. However, since the device being discussed is designed according to prior teachings to have a low resistance bulk material 106, at time T2, V-bulk 180 rapidly drops back to potential 181, the equilibrium potential. In one embodiment, V-bulk 180 drops back to equilibrium potential 181 in 10 to 100 pico-seconds, a small fraction of time interval 191.

In time interval 193, i.e., between time T3 and T4, the device is on and the drain potential is decreasing. Consequently, Vd 170 starts to fall from potential 171, typically near digital one, to potential 175, typically near digital zero, along ramp 173. Also in time interval 193, due to drain-bulk coupling capacitance 152, V-bulk 180 drops from equilibrium potential 181, typically ground, to a lower potential 187 along ramp 185 which tracks ramp 173. In one embodiment, potential 187 is 10 to 100 millivolts less than equilibrium potential 181.

During this same time frame, i.e., time interval 193, Vg 160 typically remains relatively constant at near digital one. From time T4 on, Vd 170 also remains relatively constant at near digital zero. However, since the device being discussed is designed according to prior art teachings to have a low resistance bulk material 106, at time T4, V-bulk 180 rapidly rises back to equilibrium potential 181. In one embodiment, V-bulk rises back to equilibrium potential 181 in 10 to 100 pico-seconds, a small fraction of time interval 193.

Note, in FIG. 1E, time interval 191 is shown graphically spaced from time interval 193, however those of skill in the art will recognize that in many cases time interval 191 will overlap with time interval 193 creating a more complex wave form. Consequently, the representation in FIG. 1E has been simplified for illustrative purposes.

A similar, but reversed, process takes place when the device turns off, i.e., when Vg 160 goes back to a digital zero and Vd 170 goes back to a digital one. Consequently, in prior art CMOS devices, and according to prior art teachings, V-bulk 180 remains relatively constant in response to a single switching event. As a result, the threshold voltages of prior art devices such as NFET 101, PFET 102 and prior art back biased devices 100A and 100B remain relatively constant in response to a given switching event. Therefore, while being very stable, prior art CMOS devices do not benefit from lower threshold voltages as the device turns on or relatively higher threshold voltages as the device turns off.

In contrast to prior art CMOS devices, such as NFET 101 and PFET 102 discussed above, with their relatively constant bulk material potential during a switching event and correspondingly constant threshold voltages, Partially Depleted Silicon On Insulator (PDSOI) devices have floating bulk potentials. Silicon-On-Insulator (SOI) devices are characterized by structures in which the silicon device layers are formed over an insulating film. FIG. 2A illustrates an exemplary configuration of such a device 200A. Device 200A of FIG. 2A includes an NFET 201 and a PFET 202 formed within a layer 236. Layer 236 is located along an oxide layer 208 which itself is formed atop a P+ bulk material 220. NFET 201 includes source and drain N-regions 203 and 205, respectively, a P-type channel 216 and a gate electrode 204. PFET 202 includes source and drain P-regions 208 and 210, respectively, an N-type channel 224 and a gate electrode 209. SOI devices, such as SOI device 200A, are characterized by low parasitic capacitances, as well as high dielectric isolation of the on-chip components.

A "partially depleted" SOI device refers to a structure in which the depletion region of the transistor does not extend all the way down to oxide layer 208. An example of this type of structure is shown in FIG. 2B. FIG. 2B shows a portion of a prior art partially depleted SOI NFET device 201B. In the discussion below, NFET 201B was chosen for illustrative purposes only. Those of skill in the art will recognize that a PFET device could also have been chosen and that the discussion and effects discussed below would be equally applicable, with the exception that the polarities would be reversed.

In FIG. 2B, the silicon layer 236B is relatively thick and the N-regions 203B and 205B are appropriately configured, typically through use of source-drain extensions, such that depletion region 228 is spaced from the upper surface of oxide layer 208B by a distance 230, i.e., only a portion of the P-region 216B is depleted. Consequently, when the gate potential is turned on, the potential of P-region 216B, below the depletion region 228, i.e., the "bulk region 206B" is pulled up, whereby the bulk material potential, V-bulk, of bulk material region 206B tracks the gate potential. This results in a forward biasing of the bulk region 206B that in turn decreases the threshold voltage of device 201B.

In FIG. 2C, the well-known effect of coupling capacitance between gate 204B and bulk material region 206B is represented by gate-bulk coupling capacitance 250 and the well known effects of coupling capacitance between drain 205B and bulk material region 206B is represented by drain-bulk coupling capacitance 252. Due to gate-bulk coupling capacitance 250, there is a tendency for the voltage of bulk material region 206B, V-bulk, to track the voltage on gate 204B.

FIG. 2D illustrates the well known floating body effect by showing the relationship between: the gate potential 260 (Vg 260) of gate 204B (FIG. 2B); the drain potential 270 (Vd 270) of drain 205B; and the bulk potential 280 (V-bulk 280) in a device such as partially depleted SOI device 201B designed according to the prior art structures and teachings.

In FIG. 2D, at time T0: Vg 260 is at potential 261, typically near a digital zero; Vd 270 is at potential 271, typically near a digital one; and V-bulk 280 is at potential 281. In time interval 291, i.e., between T1 and T2: Vg 260 rises along ramp 263 from potential 261, typically near digital zero, to potential 265, typically near digital one. At the same time, due to gate-bulk coupling capacitance 250, V-bulk 280 tracks Vg 260 and increases from equilibrium potential 281 to potential 283, typically greater than 281, and, in one embodiment, as high as a digital one greater than 281.

During this same time frame, i.e., time interval 291, Vd 270 remains relatively constant at near digital one. From time T2 to time T3, Vg 260 and V-bulk 280 remain relatively constant at their respective values 265 and 283.

In time interval 293, i.e., between time T3 and T4, Vd 270 starts to fall from potential 271, typically near digital one, to potential 275, typically near digital zero, along ramp 273. Also in time interval 293, due to drain-bulk coupling capacitance 252, V-bulk 280 partially tracks Vd 270 and drops from potential 283 to a lower potential 287, which, in one embodiment, is as much as a digital one below 283, along ramp 285, which tracks ramp 273. During this same time frame, i.e., time interval 293, Vg 260 typically remains relatively constant at near digital one. From time T4 on, Vd 270 remains at near digital zero.

Note, in FIG. 2D, time interval 291 is shown graphically spaced from time interval 293, however those of skill in the art will recognize that in many cases time interval 291 will overlap with time interval 293 creating a more complex wave form. Consequently, the representation in FIG. 2D has been simplified for illustrative purposes.

Importantly, from time T4 on, V-bulk 280 remains relatively constant at potential 287, which, in FIG. 2D, is a higher potential than the equilibrium potential 281. Note, however, that in other instances, it is possible that potential 287 will be lower than potential 281, depending on the relative magnitude of coupling capacitances 250 and 252. Consequently, V-bulk 280 typically does not return to its equilibrium potential 281 before the next clock and becomes unpredictable with each successive clock period. This is the essence of the floating body effect discussed above.

A similar, but reversed, process takes place as the device turns off, i.e., when Vg 260 goes back to a digital zero and Vd 270 goes back to a digital one. However, each cycle results in continued variation in the starting potential of V-bulk 280. Consequently, in prior art SOI devices, the benefits of V-bulk 280 tracking the gate potential Vg 260, i.e., lowering the threshold voltage as the device turns on and raising the threshold voltage as the device turns off, are outweighed by the uncertainty of V-bulk 280, i.e., the floating body effect.

As discussed above, lowering the threshold voltage during switching of a device, such as NFET 201B, has several benefits including higher performance and/or lowering overall power consumption. However, in SOI devices, such as devices 200A and 201B, and, in particular, partially depleted SOI devices such as device 201B, when the bulk material potential, V-bulk 280, of bulk material region 206B tracks the gate, the bulk material potential, V-bulk 280, of bulk region 206B becomes an uncontrollable and unpredictable variable. Consequently, in contrast to standard CMOS devices discussed above, in PDSOI devices, the potential V-bulk cannot be known with any certainty, i.e., it floats. Therefore, the threshold voltage of the device can vary from clock to clock and cycle to cycle.

As discussed above, in prior art CMOS devices, it is taught that the bulk material, including any wells in the bulk material, should be as low resistance as possible and V-bulk should remain as relatively constant as possible to deal with large impact ionization currents and latch-up. Consequently, prior art CMOS structures could not benefit from a variable V-bulk which tracks the gate potential and thereby lowers the threshold voltage as the device turns on.

As also discussed above, while prior art partially depleted SOI devices did allow the potential of the bulk material, V-bulk, to track the gate potential and thereby lower the threshold voltage as the device turned on, the floating body effect meant that the device typically did not return to an equilibrium potential between clock cycles. Therefore, neither V-bulk, nor the threshold voltage of the device, could be controlled or predicted.

What is needed is a device whose threshold voltage lowers as the device turns on and then rises as the device turns off, like a partially depleted SOI device, yet has the equilibrium stability of prior art CMOS devices so that V-bulk returns to a relatively known value within one clock period. Consequently, what is needed is a device that allows the bulk material potential to track the gate potential to lower the threshold voltage as the device turns on and raise the threshold voltage as the device turns off, yet allows the bulk material potential to be controlled and stabilize at an equilibrium potential between clock periods.

SUMMARY OF THE INVENTION

One embodiment of the invention includes a method for varying the threshold voltage of a device, the method comprising: providing a bulk material of a first conductivity type; forming source and drain regions within the bulk material, the source and drain regions being separated by a channel region, the source and drain regions having a second conductivity type; forming a gate over the channel region; forming a resistive well of the first conductivity type with an average dopant concentration of the first conductivity type chosen to provide a resistance per unit length in said resistive well within a desired range, the resistive well being positioned in the bulk material below the channel region; electrically coupling the bulk material to a first location in the resistive well; forming a well tie of the first conductivity type within the bulk material, the well tie being positioned beside one of the source or drain regions and outside the channel region; electrically coupling the well tie to a second location in the resistive well, wherein the first position in the resistive well and the second position in the resistive well are separated by a horizontal distance such that the resistive well provides a resistive path, thereby creating an equivalent resistor between the well tie and the bulk material.

One embodiment of the method of the invention also includes choosing the horizontal distance between the first position in the resistive well and the second position in the resistive well so as to provide a equivalent resistor having a resistance within a desired range between the well tie and the bulk material.

One embodiment of the method of the invention also includes coupling the well tie to a first supply voltage; and coupling the source to a second supply voltage.

In one embodiment of the method of the invention the device is characterized as having an on current and an off current, and the ratio of on current to off current in the device is not greater than about $10^5$.

In one embodiment of the method of the invention, the device has an unbiased threshold voltage of between about −150 millivolts and +150 millivolts.

In contrast to the structures and teachings of the prior art, the present invention includes a method for providing at least one low power MOS device that includes resistive wells specifically designed to provide a resistive path between the bulk material of the device and a well tie contact. By providing a resistive path as taught by the invention, an equivalent RC circuit is introduced to the device that allows the bulk material potential to track the gate potential during switching, thereby lowering the threshold voltage as the device turns on and raising the threshold voltage as the device turns off. This gives devices designed according to the invention the positive attributes of prior art partially depleted SOI devices. However, the introduction of the resistive path, in accordance with the invention, also allows the bulk material potential to be controlled and stabilized at an equilibrium potential between clock periods. Therefore, devices designed according to the principles of the invention do not suffer from the floating body effect associated with prior art partially depleted SOI devices.

In addition, the devices according to one embodiment of the invention are designed to be used in a low-power or ultra-low power environment. Consequently, in contrast to prior art CMOS devices, the present invention can include resistive wells without fear of voltage drops across the bulk material that are associated with large impact ionization currents and/or latch-up and device self-destruct.

As a result of these and other features discussed in more detail below, devices designed according to the principles of the present invention have the desirable attributes of both prior art CMOS devices and prior art PDSOI devices, without the drawbacks of either of these prior art devices.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 3A:
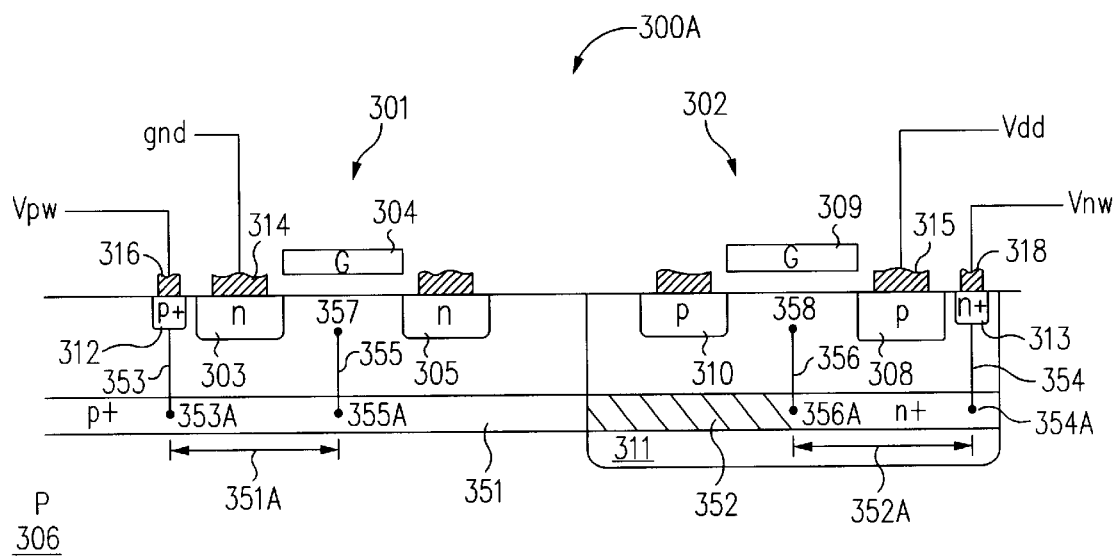
FIG. 3A shows one embodiment of a device in accordance with the principles of the present invention.

FIG. 3A illustrates a resistive well device 300A according to one embodiment of the invention. Device 300A includes an NFET 301 and a PFET 302 each of which is essentially a four-terminal device. NFET 301 is made up of an N-region source 303, a gate electrode 304, an N-region drain 305, formed in p-bulk material 306. Similarly, PFET 302 includes P-region source 308, a gate electrode 309 and a P-region drain 310 formed in an N-well bulk material 311. The device of FIG. 3A also includes a P plug that forms a well tie 312 and an N plug that forms a well tie 313.

In resistive well device 300A, according to one embodiment of the invention, well tie 312 is electrically isolated from source terminal 303 of the NFET 301 by providing a separate metallic rail contact 316 which is spaced from the metallic rail contact 314 of source 303. Rail contact 316 is connected to a bias voltage source Vpw. Likewise, well contact 313 is split off from source 308 of PFET 302 by providing a separate metallic rail contact 318 that is electrically isolated from metallic rail contact 315 of source 308. Rail contact 318 is connected to a bias voltage source Vnw.

According to the invention, resistive well device 300A also includes resistive wells 351 and 352. According to one embodiment of the invention, resistive well 351 is a P-type well. In one embodiment of the invention, resistive well 351 is doped with P-type dopant atoms to provide the desired resistance level as discussed below. According to one embodiment of the invention, resistive well 352 is an N-type well. In one embodiment of the invention, resistive well 352 is doped with N-type dopant atoms to provide the desired resistance level, as also discussed below.

According to one embodiment of the invention, the P+ plug that forms well tie 312 is electrically coupled to point 353A in resistive well 351 through path 353 and point 357 in bulk material 306, below the channel of NFET 301, is electrically coupled to point 355A in resistive well 351 through path 355. A horizontal distance 351A separates point 353A from point 355A. According to the invention, the value of distance 351A is predetermined to provide a resistance within a desired range, as discussed in more detail below.

Similarly, according to one embodiment of the invention, the N+ plug that forms well tie 313 is electrically coupled to point 354A in resistive well 352 through path 354 and point 358 in N-well bulk material 311, below the channel of PFET 302, is electrically coupled to point 356A in resistive well 352 through path 356. A horizontal distance 352A separates point 354A from point 356A. According to the invention, the value of distance 352A is predetermined to provide a resistance within a desired range, as also discussed in more detail below.

In one embodiment of the invention, resistive wells 351 and 352, according to the invention, are created by dopant implantation methods well know to those of skill in the art. The concentration and depth of implantation will vary from application to application. In particular, the resistivity of the well can be engineered by modifying its geometry (length, width, and thickness) as well as the dopant concentration laterally along its length. As discussed in more detail below, the goal is to compensate for the distance from a device to the nearest well contact, and according to the simultaneous switching activity in the vicinity of the device to achieve a well resistivity that restores the device's well potential to equilibrium before it switches again. Thus, according to the invention, the dopant concentration and well dimensions are varied to adjust the resulting resistance per unit length of resistive wells 351 and 352. In one embodiment of the invention, the P-type dopant concentration in P-type resistive well 351 is in the approximate range of $1 \times e^{14}$ to $1 \times e^{17}$ per $cm^3$ and the thickness of resistive well 351 is approximately 0.1 micrometer to yield a resistance of approximately 10 kilo-ohms to 10 mega-ohm per square.

In one embodiment of the invention the N-type dopant concentration in N-type resistive well 352 is in the approximate range of $1 \times e^{16}$ to $1 \times e^{18}$ per $cm^3$ and the thickness of resistive well 352 is approximately 0.1 micrometer to yield a resistance of approximately 100 ohms to 100 kilo-ohms per square.

Those of skill in the art will note that N-well 352 layer is much less resistive than P-well 351 in this example and recognize that in an N-well technology, it is easier to shape the N-well/buried N-well path to optimize its resistivity than it is to shape the P-well path, since the entire P-substrate is P-type.

Also according to the invention, it is not necessary for the resistivity to be uniform within the well, just that it lie within bounds that both enable a transient floating body effect during turn-on and a return to an equilibrium potential before the next time the gate switches.

In another embodiment of the invention, resistive wells 351 and 352 are formed by implanting surface profiles to form the wells, then forming a surface layer of silicon (not shown) either through epitaxial growth or amorphous deposition followed by solid phase epitaxy to crystallize the surface layer. This method has the advantage that it avoids a potential problem implanting wells resulting from the increased dopant concentration in the surface tail of a deep implant.

As discussed above, the dopant concentration in resistive wells 351 and 352 can be varied to yield a desired resistance. In addition, the overall resistance between points 353A and 355A, in resistive well 351, and points 354A and 356A, in resistive well 352, can be varied by increasing or decreasing the horizontal distances 351A and 352A in resistive wells 351 and 352, respectively. Therefore, a higher resistance can be achieved by increasing the value of 351A and 352A, or a lower resistance can be achieved by decreasing the value of 351A and 352A.

The specific examples given above are for illustrative purposes only. Those of skill in the art will readily recognize that virtually any resistance per unit length, and overall resistance, can be achieved and that different applications and devices will benefit from different resistances.

Figure 1A:
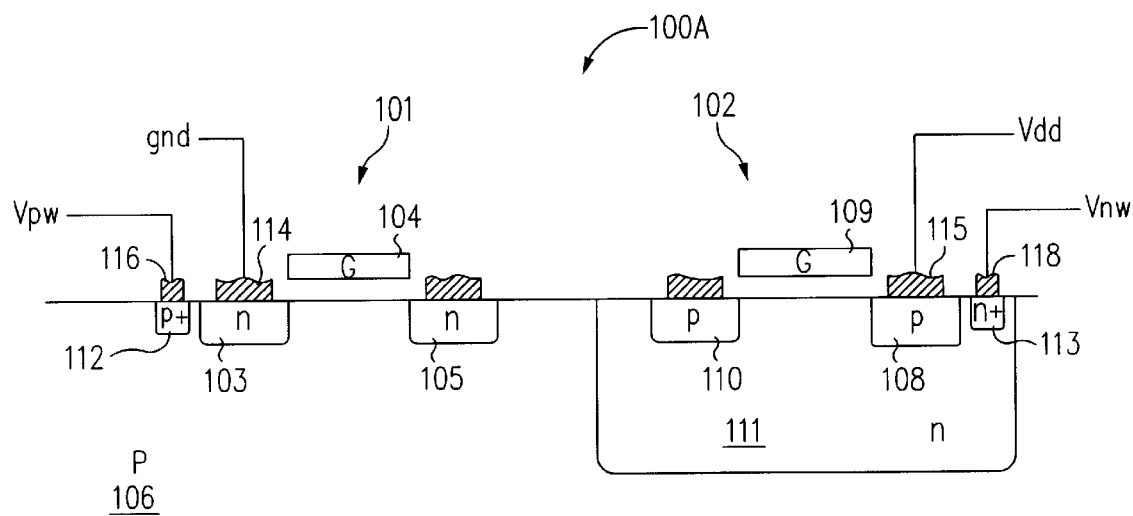
FIG. 1A shows a prior art CMOS device in which each of an NFET and a PFET essentially constitute a four-terminal device.
Figure 1B:
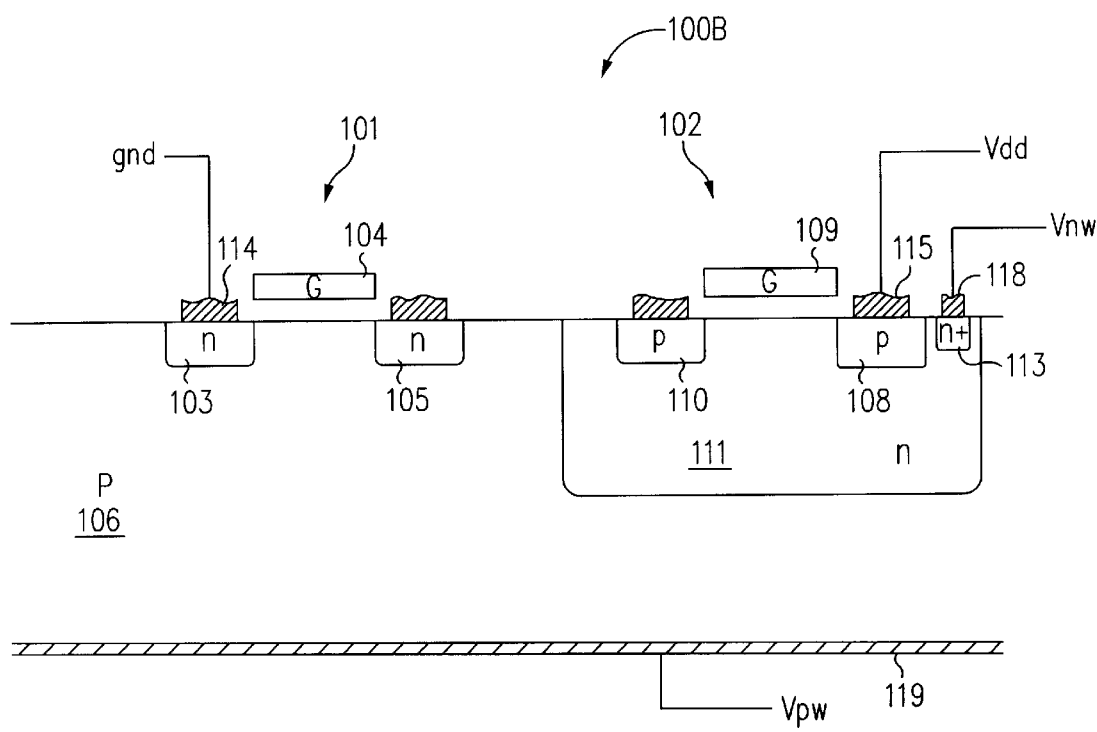
FIG. 1B shows a prior art device similar to the device of FIG. 1A, except that the substrate or bulk material of the NFET in FIG. 1B is biased by way of a metallic back plane, rather than by way of a well tie.
Figure 1C:
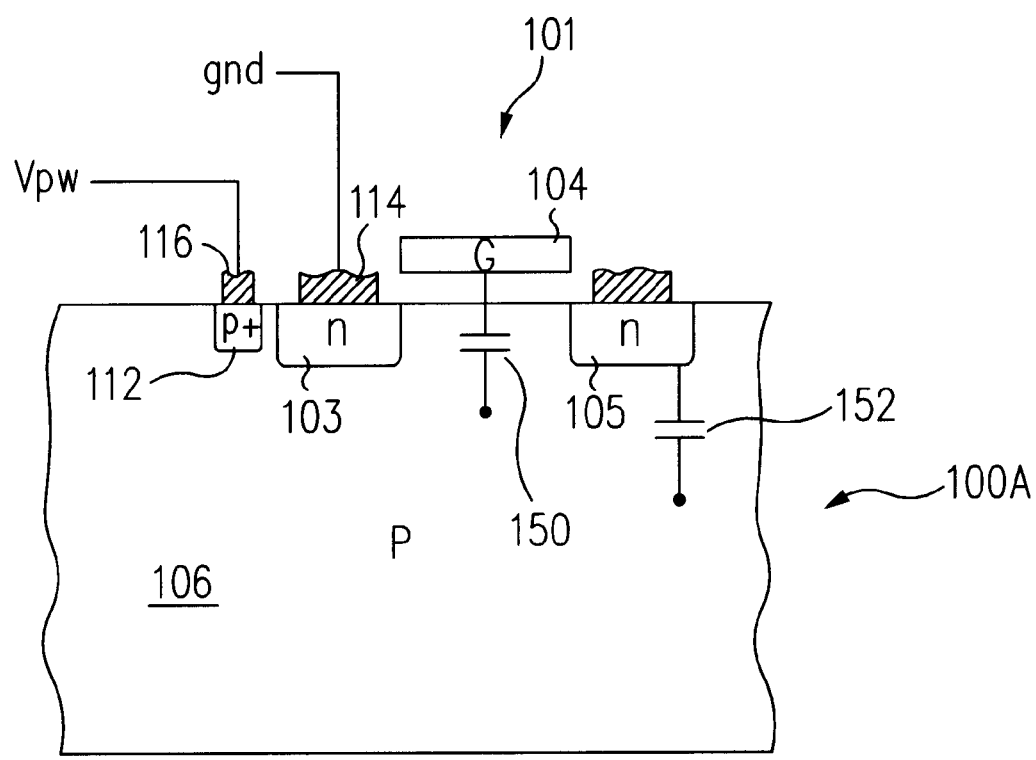
FIG. 1C shows a portion of a prior art back biased device, including an NFET, and the well-known effect of coupling capacitance between the gate and the bulk material region and the well known effect of coupling capacitance between the drain and the bulk material region in prior art CMOS devices.
Figure 1D:
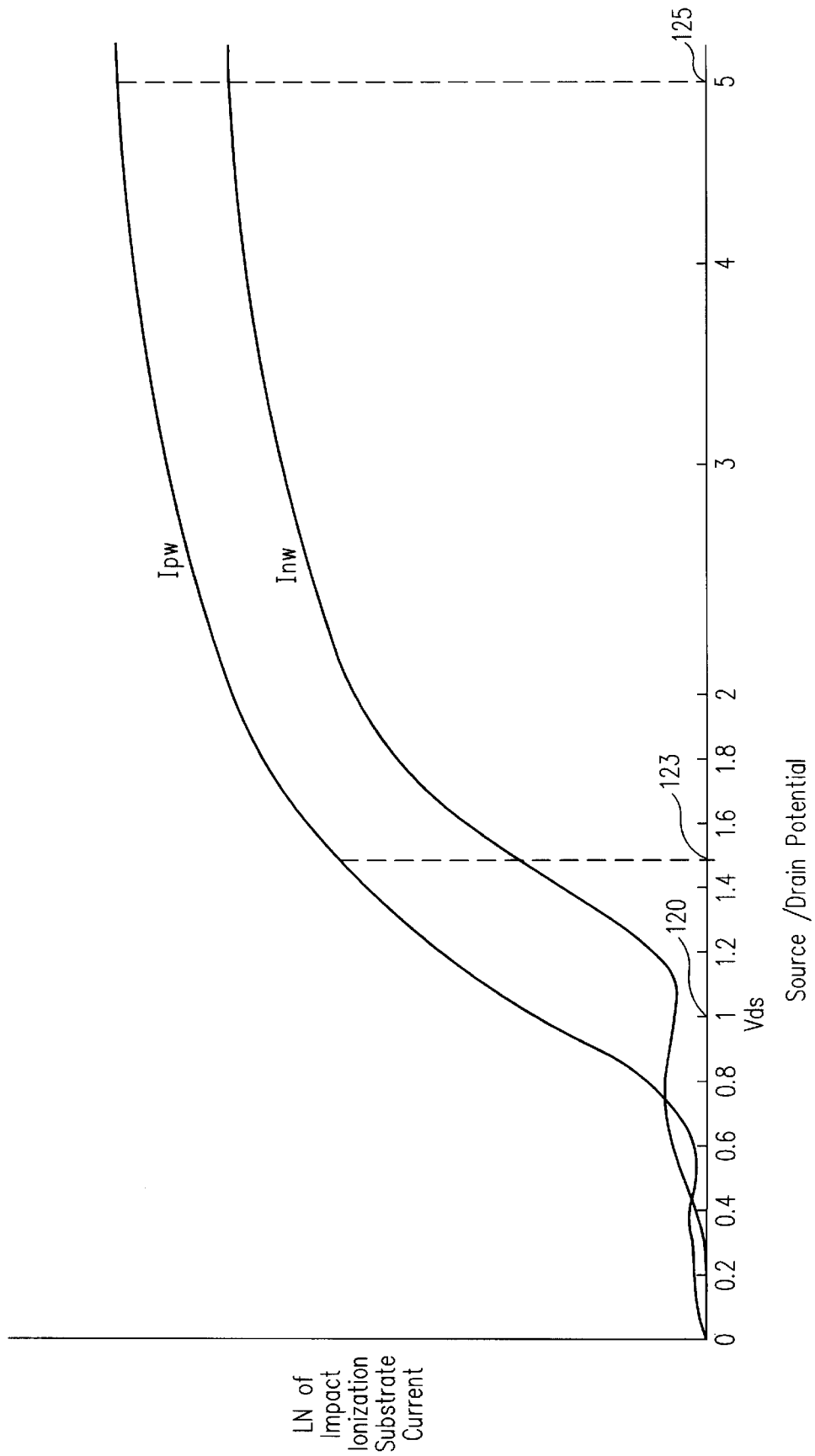
FIG. 1D shows a graph of the natural log of the substrate current due to impact ionization as a function of the source to drain potential of a device.

As discussed above, in the prior art CMOS devices it was specifically taught that providing a resistive path between well tie 312 and point 357 in bulk material 306, or between well tie 313 and point 358 in N-well bulk material 311, was to be avoided. As also discussed above, this teaching was adopted in light of the dual dangers of voltage drops due to large impact ionization currents and/or latch-up. However, as also discussed above, at source/drain (Vds) voltages of less than one volt, impact ionization currents drop off to insignificant levels (see FIG. 1D) and latch-up can be avoided by operating at supply voltages of less than 0.8 volt.

In addition, standard CMOS devices such as NFET 101 (FIG. 1C) require higher threshold voltages and higher threshold voltages require a higher well dopant concentration, which also tends to lower well resistivity in the vicinity of the channel. Consequently, while it is possible to engineer a resistive well in standard CMOS, it is easier in low power or ultra-low power CMOS, because the thresholds are lower and the well resistivity is naturally higher.

Figure 3B:
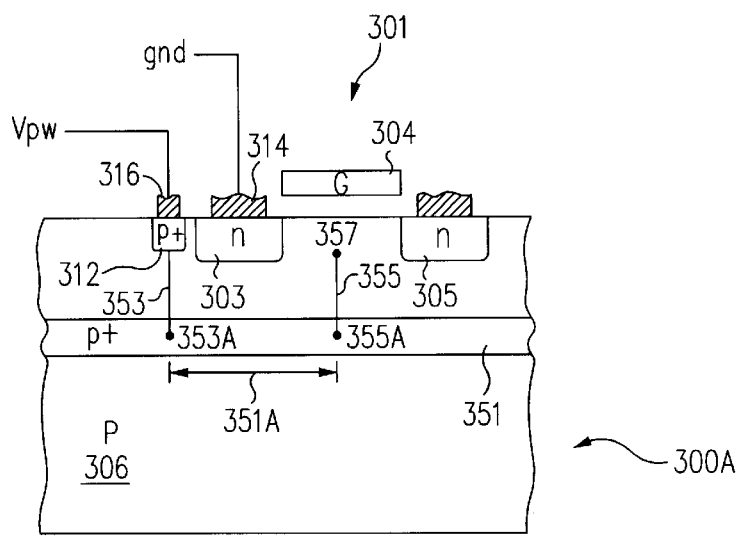
FIG. 3B shows a portion of the device of FIG. 3A, including an NFET in more detail, in accordance with the principles of the present invention.
Figure 3C:
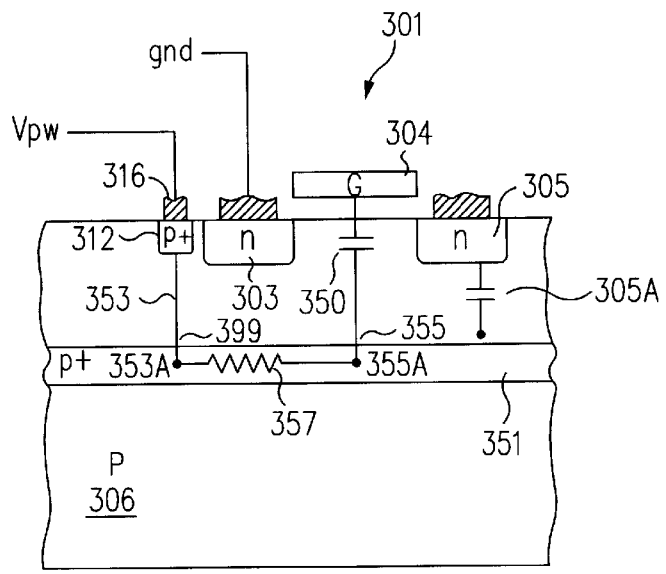
FIG. 3C shows the equivalent RC circuit in the device of FIG. 3B, formed by the coupling capacitance between the gate and the bulk material and the resistance of the resistive well, in accordance with the principles of the present invention.

In one embodiment of the invention, the structures of FIGS. 3A, 3B and 3C are low-power or ultra-low power devices where the source/drain (Vds) voltages, and the supply voltages, are significantly below 0.8 volt. In one embodiment of the invention, the supply voltage operates between 0.2 volt and 0.6 volt, depending on the operating conditions resulting in source/drain voltages between 0.2 volt and 0.6 volt.

By employing the structure of FIG. 3A in a low-power or ultra-low power environment, the present invention can be utilized without fear of large impact ionization currents, and the associated voltage drops across the bulk materials 306 and 311, and without fear of latch-up or device self destruct, as was the fear in the prior art.

FIG. 3B shows a portion of device 300A of FIG. 3A including NFET 301 in more detail. In the discussion below, NFET 301 was chosen for illustrative purposes only. Those of skill in the art will recognize that PFET 302 could also have been chosen and that the discussion and effects discussed below would be equally applicable, with the exception that the polarities would be reversed.

FIG. 3B shows NFET 301 including: N-region source 303; gate electrode 304; N-region drain 305; P-bulk material 306; well tie 312, that is electrically coupled to point 353A in resistive well 351 through path 353; and point 357 in bulk material 306, that is electrically coupled to point 355A in resistive well 351 through path 355. Horizontal distance 351A separating point 353A from point 355A is also shown.

In FIG. 3C, the well-known effect of coupling capacitance between gate 304 and bulk material 306 is represented by gate-bulk coupling capacitance 350 and the well known effect of coupling capacitance between drain 305 and bulk material 306 is represented by drain-bulk coupling capacitance 305A. In addition, the resistance of resistive well 351, between points 353A and 355A, according to the invention, is represented by equivalent resistor 357. Consequently, an equivalent RC circuit 399 is formed between well tie 312 and gate 304 using the structure of the invention.

Series RC circuits, such as equivalent RC circuit 399, and their behavior are well known in the art. If it is assumed that gate-bulk coupling capacitance 350 is uncharged when a potential is applied to gate 304, then the initial potential across gate-bulk coupling capacitance 350 is zero and the voltage difference between gate 304 and well tie 312 is dropped across equivalent resistor 357, i.e., between points 353A and 355A of resistive well 351. As gate-bulk coupling capacitance 350 charges, the voltage across gate-bulk coupling capacitance 350 increases and the voltage across equivalent resistance 357 decreases. After a long enough time passes, i.e., in steady state, all the voltage difference between gate 304 and well tie 312 is dropped across gate-bulk coupling capacitance 350 and the voltage drop across equivalent resistance 357 is zero.

Figure 3D:
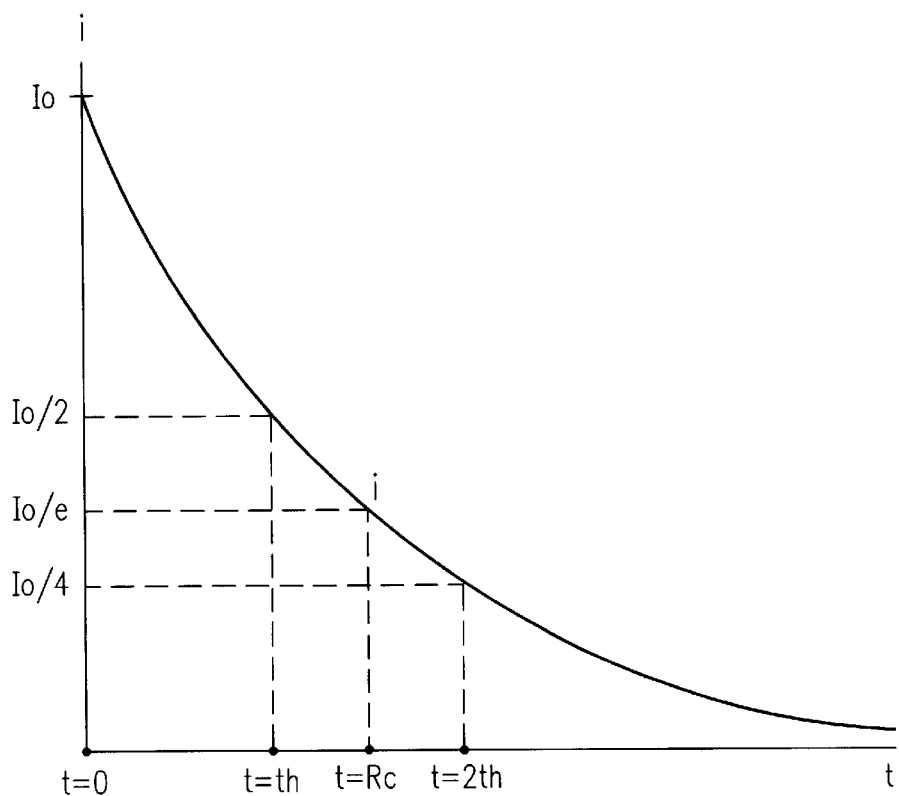
FIG. 3D shows the current (i), in an equivalent RC circuit in accordance with the principles of the present invention, as a function of time (t)

The result of this process is that the current in equivalent RC circuit 399, as well as the voltage drop across gate-bulk coupling capacitance 350 and the voltage drop across equivalent resistor 357, are exponential functions of time. FIG. 3D shows the current (i) in equivalent RC circuit 399 as a function of time (t). As can be seen in FIG. 3D, at time t=0, i.e., when a potential is applied to gate 304, current i is equal to I0. At t=th, current i has dropped to I0/2, half the initial value of i. By time t=RC, i.e., t equals the resistance of equivalent resistor 357 multiplied by the capacitance of gate-bulk coupling capacitance 350, current i has dropped to I0/e and, by time t=2th, i has dropped to I0/4.

The product RC, i.e., the resistance of equivalent resistor 357 multiplied by the capacitance of gate-bulk coupling capacitance 350, is called the time constant, or relaxation time, of equivalent RC circuit 399. Consequently, as can be seen in FIG. 3D, the relaxation time can be adjusted by choosing the appropriate value for equivalent resistor 357.

As discussed above, the dopant concentration in resistive wells 351 and 352 (FIG. 3A) can be varied to yield a desired resistance. In addition, the overall resistance between points 353A and 355A, in resistive well 351, and points 354A and 356A, in resistive well 352, can be varied by increasing or decreasing the horizontal distances 351A and 352A in resistive wells 351 and 352, respectively (FIG. 3A).

As a result, according to the invention, the relaxation time of equivalent RC circuit 399 (FIG. 3C) can be adjusted either by varying the dopant concentration of resistive well 351 or by varying the distance between points 353A and 355A in resistive well 351. In one embodiment of the invention, the dopant concentration and the distance between points 353A and 355A in resistive well 351 are selected so that the relaxation time (RC) of equivalent RC circuit 399 is five to fifty times the ramp time (391 and 393 in FIG. 3E) of the potential on gate 304 and drain 305. Consequently, the potential of the bulk material, V-bulk, (380 in FIG. 3E) returns to an equilibrium potential (381 in FIG. 3E) before the next clock period. This aspect of the invention, and FIG. 3E, are discussed in more detail below.

The result of creating equivalent RC circuit 399, using the resistive wells according to the method of the invention, is best described with reference to FIG. 3E. FIG. 3E shows the relationship between: the gate potential 360 (Vg 360) of gate 304 (FIG. 3B); the drain potential 370 (Vd 370) of drain 305; and the bulk potential 380 (V-bulk 380) in device 301. As shown in FIG. 3E, at time T0: Vg 360 is at potential 361, typically near a digital zero; Vd 370 is at potential 371, typically near a digital one; and V-bulk 380 is at equilibrium potential 381, in one embodiment ground. In time interval 391, i.e., between T1 and T2: Vg 360 rises along ramp 363 from potential 361, typically near digital zero, to potential 365, typically near digital one; at the same time, due to gate-bulk coupling capacitance 350, V-bulk 381 tracks Vg 360 and increases from potential 381, typically ground, to potential 383, typically greater than ground, but less than digital one, along ramp 382. In one embodiment of the invention, V-bulk rises ⅓ to ⅕ the amount Vg rises. During this same time frame, i.e., time interval 391, Vd 370 remains relatively constant at near digital one. In time interval 395, i.e., from time T2 to time T3, Vg 360 remains relatively constant at value 365. However, with the introduction of equivalent RC circuit 399 (FIG. 3C) using the resistive wells according to the method and structure of the invention, V-bulk 380 falls back to equilibrium potential 381 along RC curve 384 such that by time T3, V-bulk 380 is back at virtually the same equilibrium potential 381 as it was at time T0. In addition, as discussed above, using the method and structure of the invention, the time for V-bulk 380 to fall back to equilibrium potential 381, i.e., time interval 395, can be predetermined by pre-selecting the appropriate doping levels of the resistive well 351 (FIG. 3B), the distance 351A between points 353A and 355A in resistive well 351 and the shape of well 351.

In time interval 393, i.e., between time T4 and T5, Vd 370 starts to fall from potential 371, typically near digital one, to potential 375, typically near digital zero, along ramp 373. Also in time interval 393, due to drain-bulk coupling capacitance 305A, V-bulk 380 tracks Vd 370 and drops from equilibrium potential 381 to a lower potential 387. In one embodiment of the invention, V-bulk falls ⅓ o ⅕ the amount Vd falls, along ramp 385 which tracks ramp 373. During this same time frame, i.e., time interval 393, Vg 360 typically remains relatively constant at near digital one. From time T5 forward, Vd 370 remains relatively constant at near digital zero. However, with the introduction of equivalent RC circuit 399 (FIG. 3C) using resistive wells according to the method of the invention, V-bulk 380 rises back to equilibrium potential 381 along RC curve 389 such that by time T6, V-bulk 380 is back at virtually the same equilibrium potential 381 as it was at time T0. In addition, as discussed above, using the method and structure of the invention, the time for V-bulk 380 to rise back to equilibrium potential 381, i.e., time interval 397, can be predetermined by pre-selecting the appropriate doping levels of the resistive well 351 (FIG. 3B) and the distance 351A between points 353A and 355A in resistive well 351.

Figure 3E:
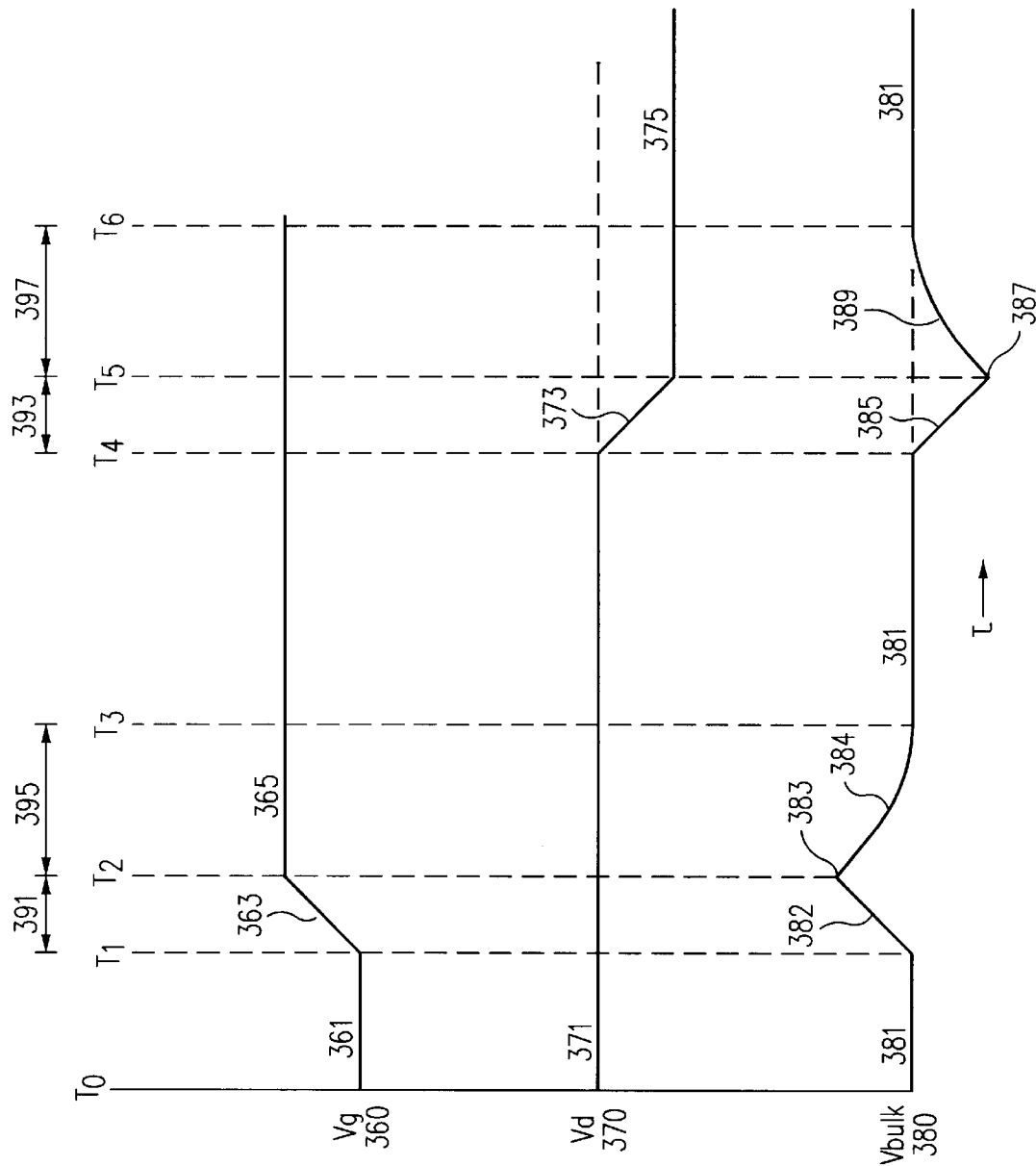
FIG. 3E shows the relationship between: the gate potential (Vg); the drain potential (Vd); and the bulk potential (V-bulk) in the device of FIG. 3B, in accordance with the principles of the present invention.

Note, in FIG. 3E, time interval 391 is shown graphically spaced from time interval 393, however those of skill in the art will recognize that in many cases time interval 391 will overlap with time interval 393 creating a more complex wave form. Consequently, the representation in FIG. 3E has been simplified for illustrative purposes.

As discussed above, according to the invention, the relaxation time (RC) of equivalent RC circuit 399 (FIG. 3C) can be adjusted either by varying the dopant concentration of resistive well 351 or by varying the distance between points 353A and 355A in resistive well 351. In one embodiment of the invention, the dopant concentration and the distance between points 353A and 355A in resistive well 351 are selected so that the relaxation time (RC), i.e., time intervals 395 and 397 in FIG. 3E, of equivalent RC circuit 399, and V-bulk 380, is five to fifty times the ramp time, i.e., time intervals 391 and 393 in FIG. 3E, of Vg 360 and Vd 370. Consequently, the potential of bulk material 306, V-bulk 380, returns to equilibrium potential 381 before the next clock period.

Figure 1E:
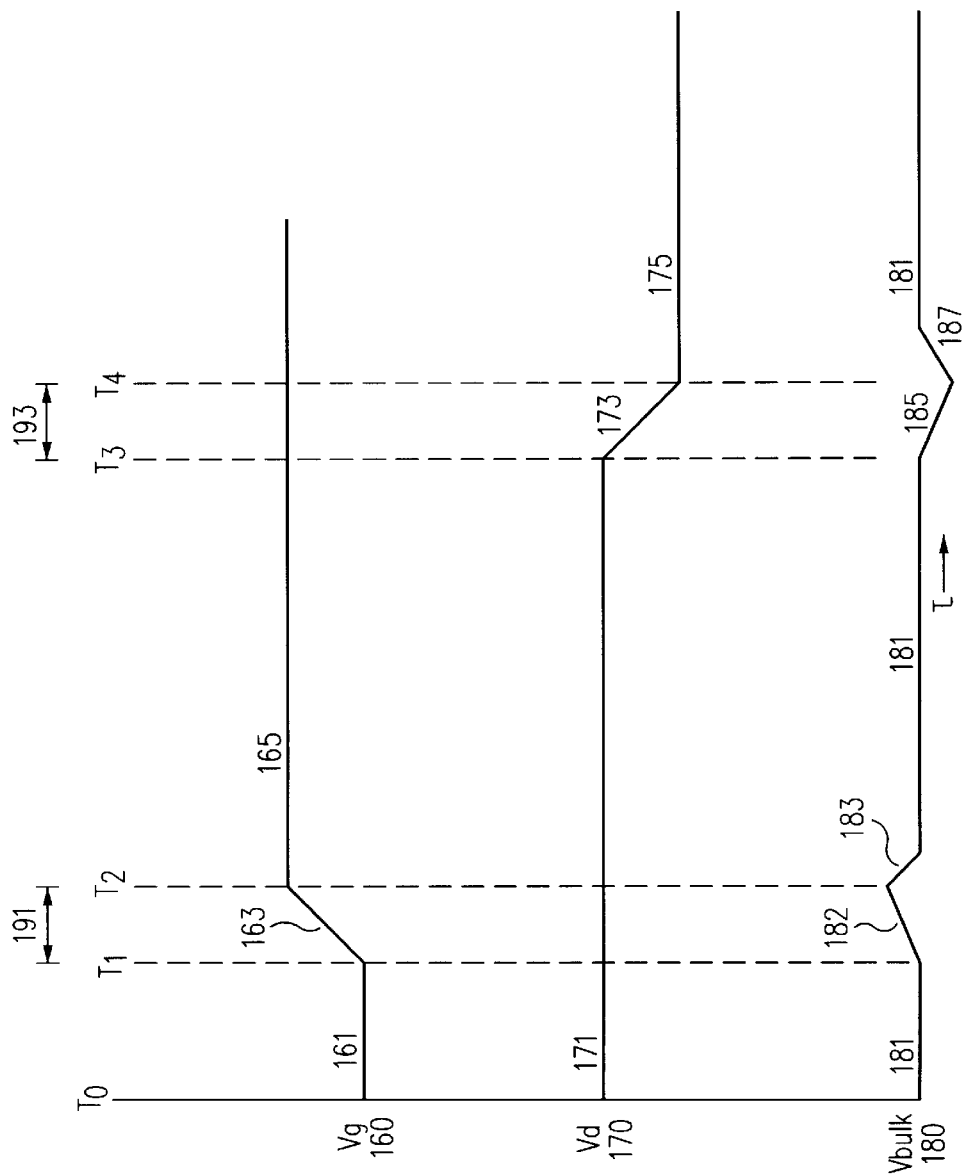
FIG. 1E shows the relationship between: the gate potential (Vg); the drain potential (Vd); and the bulk potential (V-bulk) in a prior art CMOS device designed according to the prior art teachings.
Figure 2A:
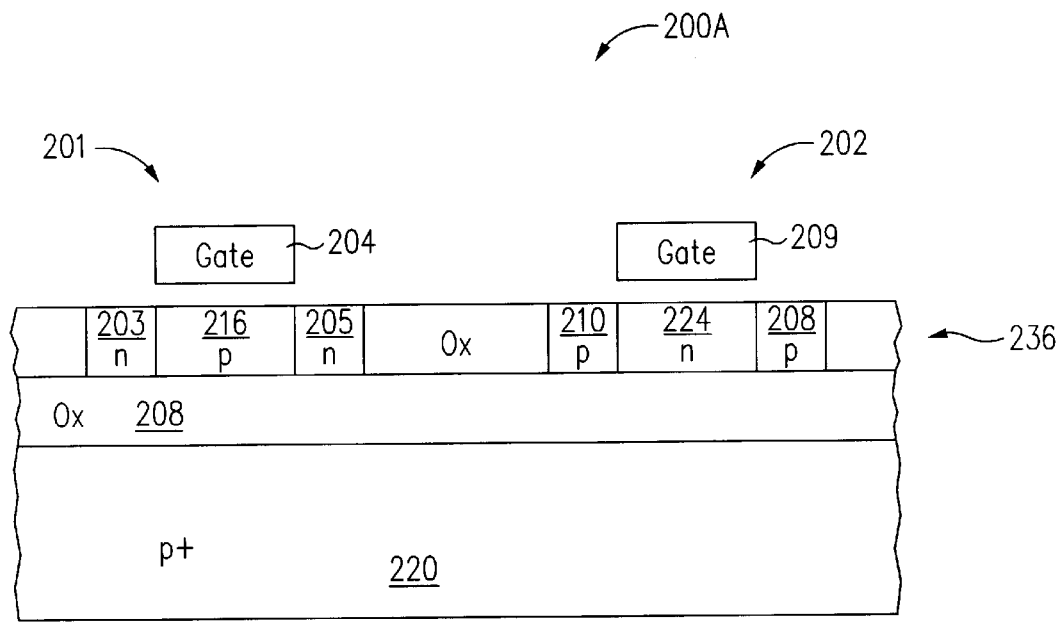
FIG. 2A illustrates an exemplary prior art SOI device.
Figure 2B:
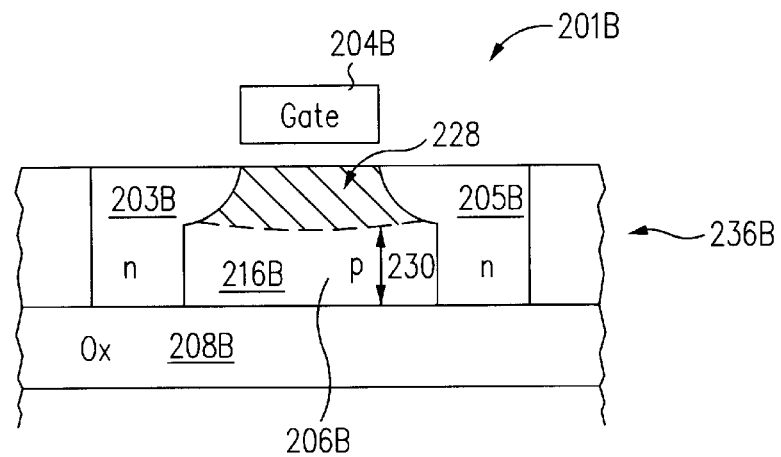
FIG.2B shows a portion of a prior art partially depleted SOI NFET device.
Figure 2C:
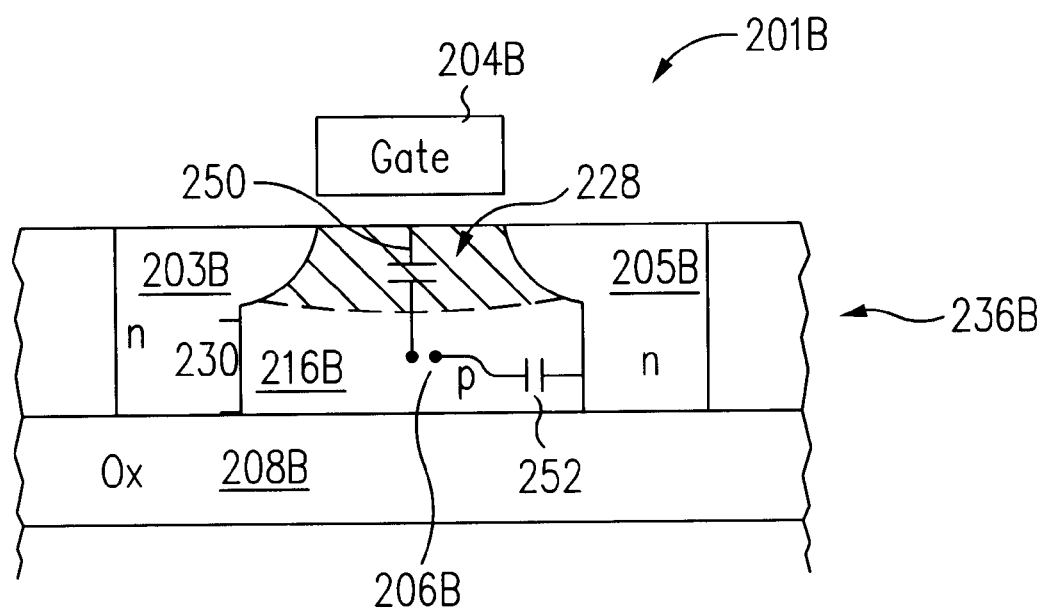
FIG. 2C shows the well-known effect of coupling capacitance between the gate and the bulk material region and the well known effect of coupling capacitance between the drain and the bulk material region in prior art partially depleted SOI devices.
Figure 2D:
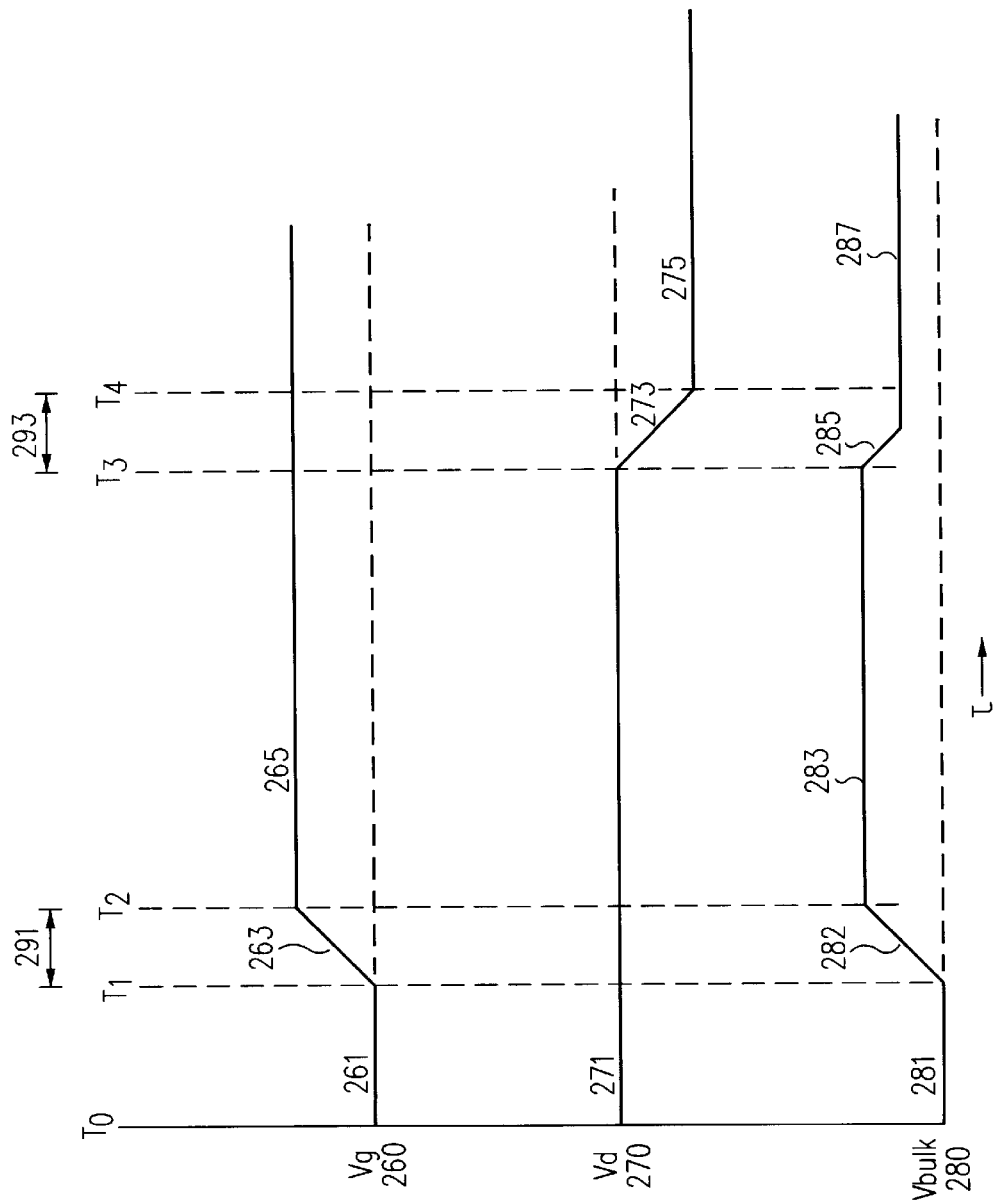
FIG. 2D illustrates the floating body effect by showing the relationship between: the gate potential (Vg); the drain potential (Vd); and the bulk potential (V-bulk) in a partially depleted SOI device designed according to the prior art structures and teachings.

As shown in FIG. 3E, with the introduction of equivalent RC circuit 399 according to the invention, V-bulk 380 tracks Vg 360 during time interval 391, just like prior art partially depleted SOI device 200A (See FIGS. 2C and 2D). Consequently, when the device is turning on, the threshold voltage of NFET 301 is advantageously lowered (FIG. 3E). Then, once NFET 301 is turned on, because of the introduction of equivalent resistance 357 (FIG. 3C) and equivalent RC circuit 399 according to the invention, V-bulk 380 falls back to equilibrium potential 381 (FIG. 3E) before the next clock period. Thus, NFET 301 shows the stability of prior art CMOS devices with a predictable and stable bulk material potential, V-bulk 380, and threshold voltage (FIG. 1E).

A similar, but reversed, process takes place when the device turns off, i.e., when Vg 360 goes back to a digital zero and Vd 370 goes back to a digital one. Consequently, the method of the invention provides for devices whose threshold voltage lowers as the device turns on and then rises as the device turns off, like a partially depleted SOI device, yet has the equilibrium stability of prior art CMOS devices so that V-bulk returns to a known value within one clock period.

As seen above, in contrast to the structures and teachings of the prior art, the present invention includes a method and structure for providing low power MOS devices that include wells specifically designed to provide a resistive path between the bulk material of the device and a well tie contact. By providing a resistive path, an equivalent RC circuit is introduced to the device that allows the bulk material potential to track the gate potential, thereby advantageously lowering the threshold voltage as the device turns on and raising the threshold voltage as the device turns off. This gives the devices designed according to the invention the positive attributes of prior art partially depleted SOI devices. However, the introduction of the resistive path, in accordance with the invention, also allows the bulk material potential to be controlled and stabilize at an equilibrium potential between clock periods. Therefore, devices designed according to the principles of the invention do not suffer from the floating body effect associated with prior art partially depleted SOI devices.

In addition, one embodiment of the devices according to the invention are designed to be used in a low-power or ultra-low power environment. Consequently, in contrast to prior art CMOS devices, the present invention can include resistive wells without the fear of large impact ionization current problems and/or latch-up and device self-destruct.

As a result of these and other features discussed in more detail above, devices designed according to the principles of the present invention have the desirable attributes of both prior art CMOS devices and prior art SOI devices, without the drawbacks of either of these prior art devices. Consequently, devices designed according to the principles of the invention consume less power and can better meet the needs of modern electronics markets than prior art methods or structures.

The foregoing description of an implementation of the invention has been presented for purposes of illustration and description, and therefore is not exhaustive and does not limit the invention to the precise form disclosed. Modifications and variations are possible in light of the above teachings or may be acquired from practicing the invention.

For example, for simplicity, the description above is based largely on FIG. s showing NFET devices. However, those of skill in the art will readily recognize that, with minor and well-known modifications, the invention and discussion above applies equally well to PFET devices.

In addition, the discussion above is largely directed to N-well process devices, however, those of skill will recognize that the discussion above is equally applicable to P-well process devices with minor and well-known modifications.

In addition, as shown above, one aspect of the invention is to create a sufficiently resistive connection between the source of a well's potential and the electrically active bulk region proximate a transistor channel region. This is a natural consequence of distributing the well potential in a well layer, which is much more resistive than a surface metal layer. However, in another embodiment of the invention, a resistive surface layer, such as lightly doped polysilicon, could be used as well.

Consequently, the scope of the invention is defined by the claims and their equivalents.

What is claimed is:

1. A method for varying the threshold voltage of a device, said method comprising:

providing a bulk material of a first conductivity type;

forming source and drain regions within said bulk material, said source and drain regions being separated by a channel region, said source and drain regions having a second conductivity type;

forming a gate over said channel region;

forming a resistive well of said first conductivity type with an average dopant concentration of said first conductivity type chosen to provide a resistance per unit length in said resistive well within a desired range, said resistive well being positioned in said bulk material below said channel region;

electrically coupling said bulk material to a first location in said resistive well;

forming a well tie of said first conductivity type within said bulk material, said well tie being positioned beside one of said source or drain regions and outside said channel region;

electrically coupling said well tie to a second location in said resistive well, wherein said first position in said resistive well and said second position in said resistive well are separated by a horizontal distance such that said resistive well provides a resistive path, thereby creating an equivalent resistor between said well tie and said bulk material.

2. The method of claim 1, further comprising:

choosing said horizontal distance between said first position in said resistive well and said second position in said resistive well so as to provide a equivalent resistor having a resistance within a desired range of resistance between said well tie and said bulk material.

3. The method of claim 2, further comprising: coupling said well tie to a first supply voltage; and coupling said source to a second supply voltage.

4. The method of claim 3, wherein the device is characterized as having an on current and an off current, and wherein the ratio of on current to off current in the device is not greater than about $10^5$.

5. The method of claim 4, wherein the device has an unbiased threshold voltage of between about −150 millivolts and +150 millivolts.

6. The method of claim 2, further comprising:

applying a potential to said gate bringing said gate to a gate potential in a ramp time, said potential being coupled to said bulk material by way of a gate-bulk coupling capacitance between said gate and said bulk material such that a potential of said bulk material tracks the potential of said gate, further wherein, said coupling capacitance and said equivalent resistor form an equivalent RC circuit between said bulk material and said well tie, said equivalent RC circuit having a relaxation time.

7. The method of claim 6, wherein said horizontal distance between said first position in said resistive well and said second position in said resistive well is chosen so as to provide an equivalent resistor between said well tie and said bulk material such that said relaxation time of said equivalent RC circuit is in the range of five to fifty times said ramp time of said gate potential.

8. A method for varying the threshold voltage of a device said method comprising:

providing a bulk material of P-type conductivity;

forming source and drain regions within said bulk material, said source and drain region being separated by a channel region, said source and drain regions having an N-type conductivity;

forming a gate over said channel region;

forming a resistive well of P-type conductivity with an average P-type dopant concentration chosen to provide a desired resistance per unit length in said resistive well, said resistive well being positioned in said bulk material below said channel region;

electrically coupling said bulk material to a first location in said resistive well;

forming a well tie of P-type conductivity within said bulk material, said well tie being positioned beside one of said source or drain regions and outside said channel region;

electrically coupling said well tie to a second location in said resistive well, wherein said first position in said resistive well and said second position in said resistive well are separated by a horizontal distance such that said resistive well provides a resistive path, thereby creating an equivalent resistor between said well tie and said bulk material.

9. The method of claim 8, further comprising:

choosing said horizontal distance between said first position in said resistive well and said second position in said resistive well so as to provide a equivalent resistor of a resistance within a desired range between said well tie and said bulk material.

10. The method of claim 9, further comprising: coupling said well tie to a first supply voltage; and coupling said source to a second supply voltage.

11. The method of claim 10, wherein said first supply voltage is a bias voltage Vpw and said second supply voltage is ground.

12. The method of claim 10, wherein the device is characterized as having an on current and an off current, and wherein the ratio of on current to off current in the device is not greater than about $10^5$.

13. The method device of claim 12, wherein the device has an unbiased threshold voltage of between about −150 millivolts and +150 millivolts.

14. The method of claim 9, further comprising:

applying a potential to said gate bringing said gate to a gate potential in a ramp time, said potential being coupled to said bulk material by way of a gate-bulk coupling capacitance between said gate and said bulk material such that a potential of said bulk material tracks the potential of said gate, further wherein, said coupling capacitance and said equivalent resistor form an equivalent RC circuit between said bulk material and said well tie, said equivalent RC circuit having a relaxation time.

15. The method of claim 14, wherein said horizontal distance between said first position in said resistive well and said second position in said resistive well is chosen so as to provide an equivalent resistor having a resistance within a desired range of resistance between said well tie and said bulk material such that said relaxation time of said equivalent RC circuit is in the range of five to fifty times said ramp time of said gate potential.

16. A method for varying the threshold voltage of a device said method comprising:

providing a bulk material of N-type conductivity;

forming source and drain regions within said bulk material, said source and drain regions being separated by a channel region, said source and drain regions having a P-type conductivity;

forming a gate over said channel region;

forming a resistive well of N-type conductivity with an average N-type dopant concentration chosen to provide a desired resistance per unit length in said resistive well, said resistive well being positioned in said bulk material below said channel region;

electrically coupling said bulk material to a first location in said resistive well;

forming a well tie of N-type conductivity within said bulk material, said well tie being positioned beside one of said source or drain regions and outside said channel region;

electrically coupling said well tie to a second location in said resistive well, wherein said first position in said resistive well and said second position in said resistive well are separated by a horizontal distance such that said resistive well provides a resistive path, thereby creating an equivalent resistor between said well tie and said bulk material.

17. The method of claim 16, further comprising:

choosing said horizontal distance between said first position in said resistive well and said second position in said resistive well so as to provide a equivalent resistor of having a resistance within a desired range of resistance between said well tie and said bulk material.

18. The method of claim 17, further comprising: coupling said well tie to a first supply voltage; and coupling said source to a second supply voltage.

19. The method of claim 18, wherein said first supply voltage is a bias voltage Vnw and said second supply voltage is Vdd.

20. The method of claim 16, wherein the device is characterized as having an on current and an off current, and wherein the ratio of on current to off current in the device is not greater than about $10^5$.

21. The method of claim 20, wherein the device has an unbiased threshold voltage of between about −150 millivolts and +150 millivolts.

22. The method of claim 17, further comprising:

applying a potential to said gate bringing said gate to a gate potential in a ramp time, said potential being coupled to said bulk material by way of a gate-bulk coupling capacitance between said gate and said bulk material such that a potential of said bulk material tracks the potential of said gate, further wherein, said coupling capacitance and said equivalent resistor form an equivalent RC circuit between said bulk material and said well tie, said equivalent RC circuit having a relaxation time.

23. The method of claim 22, wherein said horizontal distance between said first position in said resistive well and said second position in said resistive well is chosen so as to provide an equivalent resistor having a resistance within a desired range of resistance between said well tie and said bulk material such that said relaxation time of said equivalent RC circuit is in the range of five to fifty times said ramp time of said gate potential.

* * * * *

UNITED STATES PATENT AND TRADEMARK OFFICE
CERTIFICATE OF CORRECTION

PATENT NO. : 6,303,444 B1
DATED : October 16, 2001
INVENTOR(S) : James B. Burr

It is certified that error appears in the above-identified patent and that said Letters Patent is hereby corrected as shown below:

Column 16,
Line 37, delete the first occurrence of "device".

Signed and Sealed this

Eleventh Day of June, 2002

Attest:

Attesting Officer

JAMES E. ROGAN
Director of the United States Patent and Trademark Office